United States Patent
Chang et al.

(10) Patent No.: US 12,131,678 B1
(45) Date of Patent: Oct. 29, 2024

(54) SAFETY DETECTION METHOD FOR USE IN DISPLAY DEVICE AND RELATED TOUCH CONTROL CIRCUIT AND TOUCH AND DISPLAY DRIVER INTEGRATION

(71) Applicant: HIMAX TECHNOLOGIES LIMITED, Tainan (TW)

(72) Inventors: Yaw-Guang Chang, Tainan (TW); Chun-Yu Chiu, Tainan (TW); Ren-Yuan Huang, Tainan (TW); Chia-Yi Huang, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 18/399,732

(22) Filed: Dec. 29, 2023

(51) Int. Cl.
*G09G 3/20* (2006.01)
*G06F 3/041* (2006.01)
*G09G 3/00* (2006.01)
*H03M 1/12* (2006.01)

(52) U.S. Cl.
CPC .......... *G09G 3/20* (2013.01); *G06F 3/0412* (2013.01); *G06F 3/0416* (2013.01); *G09G 3/006* (2013.01); *H03M 1/123* (2013.01); *G09G 2310/0275* (2013.01); *G09G 2330/028* (2013.01); *G09G 2330/12* (2013.01); *G09G 2354/00* (2013.01)

(58) Field of Classification Search
None
See application file for complete search history.

(56) References Cited

U.S. PATENT DOCUMENTS

| | | | |
|---|---|---|---|
| 2006/0022930 A1* | 2/2006 | Chen | G09G 3/3688 345/98 |
| 2007/0080913 A1* | 4/2007 | Park | G09G 3/006 345/87 |
| 2010/0123649 A1* | 5/2010 | Hamer | G09G 3/3225 345/76 |
| 2015/0103065 A1* | 4/2015 | Kim | G09G 3/3614 345/212 |
| 2021/0104185 A1* | 4/2021 | Park | G09G 3/006 |
| 2021/0280106 A1* | 9/2021 | Xiong | G09G 3/006 |
| 2024/0105126 A1* | 3/2024 | Kim | G09G 3/006 |
| 2024/0265838 A1* | 8/2024 | Min | G09G 3/3291 |

* cited by examiner

*Primary Examiner* — Dorothy Harris
(74) *Attorney, Agent, or Firm* — Winston Hsu (57) ABSTRACT

A touch control circuit for use in a display device includes: a plurality of analog-to-digital converters and a controller. Each of the analog-to-digital converters is coupled to at least one of a plurality of touch sensing electrodes and at least one of a plurality of source drivers of the display device. At least one of the analog-to-digital converters is configured to generate a first measured digital code according to an output voltage outputted by the at the least one of the source drivers. The controller is coupled to the analog-to-digital converters, and configured to compare the first measured digital code with an input digital code that the output voltage of the at the least one of the source drivers corresponds to, thereby to generate a first safety detection result regarding the at least one of the source drivers.

18 Claims, 5 Drawing Sheets

(With Safety Detection)

SAFETY DETECTION METHOD FOR USE IN DISPLAY DEVICE AND RELATED TOUCH CONTROL CIRCUIT AND TOUCH AND DISPLAY DRIVER INTEGRATION

BACKGROUND OF THE INVENTION

1. Field of the Invention

The present invention relates to safety detection of integrated circuits, and more particularly, to a safety detection method and related touch control circuit and touch and display driver integration.

2. Description of the Prior Art

Automotive integrated circuits (ICs) are custom-designed for specific applications within automotive electronic systems. These ICs are engineered to meet the stringent requirements of automotive applications, such as high reliability, durability, and compliance with automotive safety standards like ISO 26262. Commonly, automotive ICs serve a variety of functions in vehicle systems, including engine control units (ECUs), sensor interfaces, infotainment systems, and advanced driver assistance systems (ADAS). Given the high demands for reliability and durability, the ISO 26262 standard outlines four safety levels: ASIL-A, ASIL-B, ASIL-C, and ASIL-D. Generally, automotive components such as the dashboard, passenger-side panel, rearview mirrors, rear-seat entertainment devices, and door handles are required to meet at least the ASIL-B safety level. The ASIL-B level necessitates compliance with specific criteria, including a single point fault metric (SPFM) of >=90% and a latent fault metric (LFM) of >=60%. In the context of automotive touch display driver integration (TDDI) IC, source driver circuitry is significant in terms of both the number of transistors and the proportion of circuit area within the TDDI IC. Without dedicated safety detection circuits designed for the source driver circuitry, it is impossible to meet the 90% single point fault requirement.

However, the implementation of specialized safety detection circuits for the source driver circuitry presents a challenge. Given the typically high number of channels of the source driver circuitry, adding dedicated safety detection circuits for each channel would inevitably result in a substantial increase in the overall circuit area of the automotive TDDI IC. To circumvent this issue, one might consider simplifying the design of safety detection circuits, but this could lead to a decrease in detection accuracy. From this, it is evident that current technologies face unresolved challenges in designing safety detection circuits for source driver circuitry inside the TDDI IC in automotive applications.

SUMMARY OF THE INVENTION

In light of this, to address the challenges of safety detection circuit in source driver circuitry and other analog voltage output circuitry within automotive TDDI IC, the present invention introduces a novel safety detection method along with an associated touch control circuit. In embodiments of the present invention, analog-to-digital converters within a touch control circuit of the TDDI IC are utilized to implement safety detection for the source driver circuitry. Since these analog-to-digital converters are idle during non-touch sensing periods, their use in the safety detection of the source driver does not disrupt the normal operation of the touch control circuit. Furthermore, the safety detection method and associated touch control circuit of the present invention can also be applied to other analog circuitry (such as voltage regulators and charge pump converters) in automotive display devices to monitor their output voltages for safety. This effectively eliminates potential errors and abnormal output voltages that may arise from various causes in these circuits. Consequently, the present invention significantly enhances the reliability of automotive TDDI IC, thereby substantially improving the safety of vehicle systems.

According to one embodiment, a touch control circuit for use in a display device is provided. The touch control circuit includes: a plurality of analog-to-digital converters and a controller. Each of the analog-to-digital converters is coupled to at least one of a plurality of touch sensing electrodes and at least one of a plurality of source drivers of the display device. At least one of the analog-to-digital converters is configured to generate a first measured digital code according to an output voltage outputted by at the least one of the source drivers. The controller is coupled to the analog-to-digital converters, and configured to compare the first measured digital code with an input digital code that the output voltage of the at the least one of the source drivers corresponds to, thereby to generate a first safety detection result regarding the at least one of the source drivers.

According to one embodiment, a safety detection method for use in a display device is provided. The safety detection method comprises: providing a touch control circuit including a plurality of analog-to-digital converters, each coupled to at least one of a plurality of touch sensing electrodes and at least one of a plurality of source drivers of the display device; utilizing at least one of the analog-to-digital converters to generate a first measured digital code according to an output voltage outputted by at the least one of the source drivers; and comparing the first measured digital code with an input digital code that the output voltage of the at the least one of the source drivers corresponds to, thereby to generate a first safety detection result regarding the at least one of the source drivers.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

Reference throughout this specification to "one embodiment" or "an embodiment" means that a particular feature, structure or characteristic described in connection with the embodiment or example is included in at least one embodiment of the present embodiments. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

Figure 1:
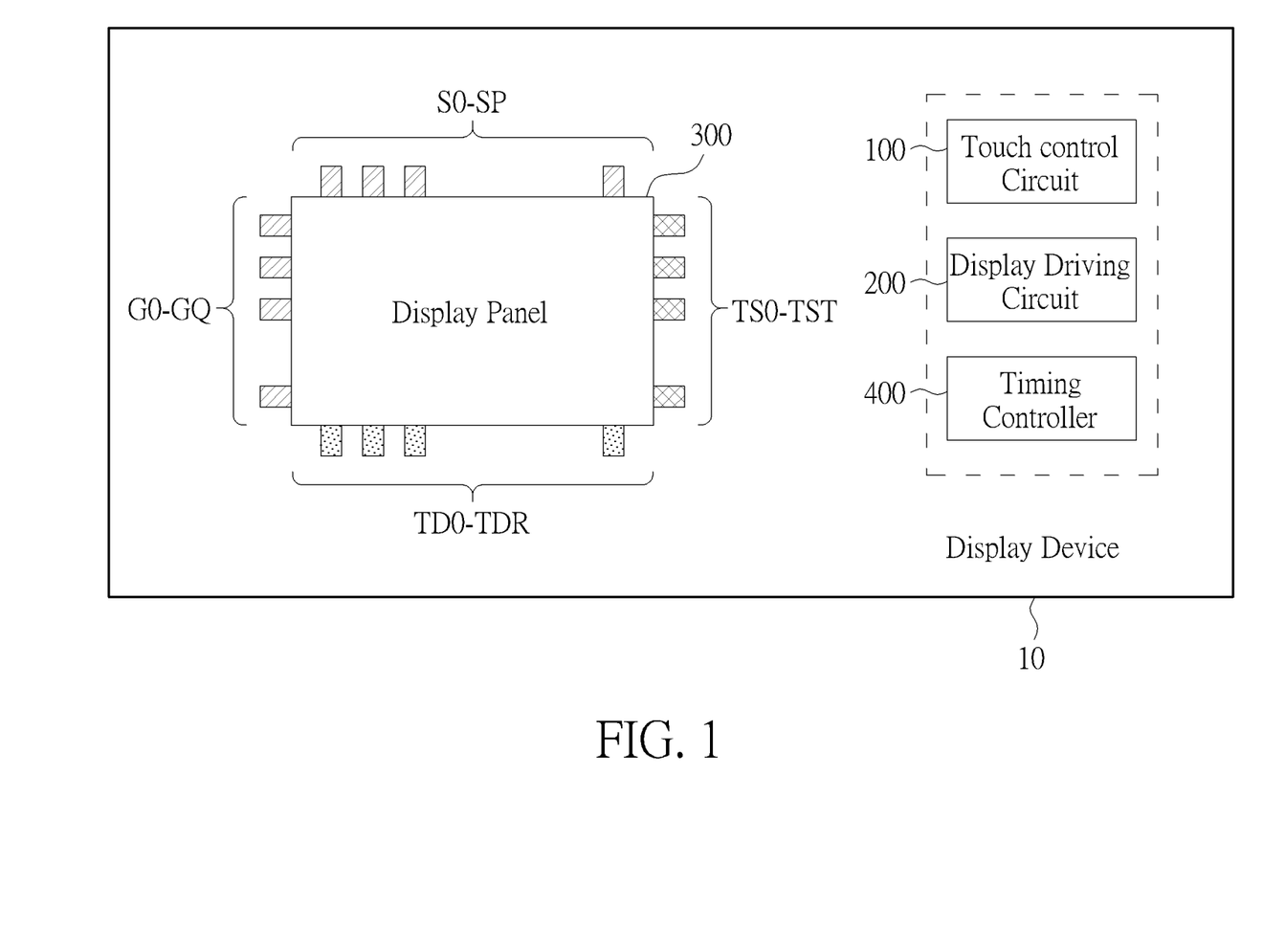
FIG. 1 depicts a schematic diagram of a display device according to one embodiment of the present invention.

Please refer to FIG. 1, which depicts a schematic diagram of a display device according to one embodiment of the present invention. As shown, a display device 10 is a touch-enabled display and comprise a display panel 300 and a touch and display driver integration integrated circuit (TDDI IC) 50. The display device 10 is the TDDI IC 50, which includes a touch control circuit 100, a display driving circuit 200, and a timing Controller 400. The touch control circuit 100 is configured to detect touch inputs on a display panel 300 of the display device 10, facilitating user interaction with the display device 10. This detection involves processing signals corresponding to touch events, such as taps or swipes, executed on the surface of the display panel 300. On the other hand, the display driving circuit 200 is configured to control pixel circuits within the display panel 300. Its function is to accurately render visual content, like videos or images, by manipulating pixel behavior, such as color and brightness, according to the video/image data and timing signals provided by the timing controller 400. The timing controller 400 is configured to synchronizes operations of the touch control circuit 100 and the display driving circuit 200, thereby to ensure that touch detection and display rendering processes are perfectly coordinated.

As depicted in FIG. 1, the display panel 300 incorporates a sophisticated arrangement of electrodes for pixel control and touch sensing. Specifically, source electrodes S0-SP and gate electrodes G0-GQ that are strategically positioned on the display panel 300, where the source electrodes S0-SP are configured to supply pixel driving voltages to the pixel circuits, and the gate electrodes G0-GQ are configured to control the timing of pixel driving voltages supplying to individual pixel circuits. The source electrodes S0-SP and gate electrodes G0-GQ are primarily controlled by the display driving circuit 200. Additionally, the display panel 300 also incorporates touch driving electrodes TD0-TDR and touch sensing electrodes TS0-TST. The touch driving electrodes TD0-TDR are configured to emit electric fields, while the touch sensing electrodes TS0-TST detect changes in electric fields caused by a user's touch. This arrangement enables the touch control circuit 100 to accurately detect and interpret touch inputs across the surface of the display panel 300. Please note that the specific arrangements of the source electrodes S0-SP, the gate electrodes G0-GQ, the touch driving electrodes TD0-TDR, and the touch sensing electrodes TS0-TST as shown in FIG. 1 are exemplary and not intended to limit the scope of the present invention. They are merely illustrative of one possible configuration among many that could achieve the desired functionality within the scope of the present invention.

Figure 2:
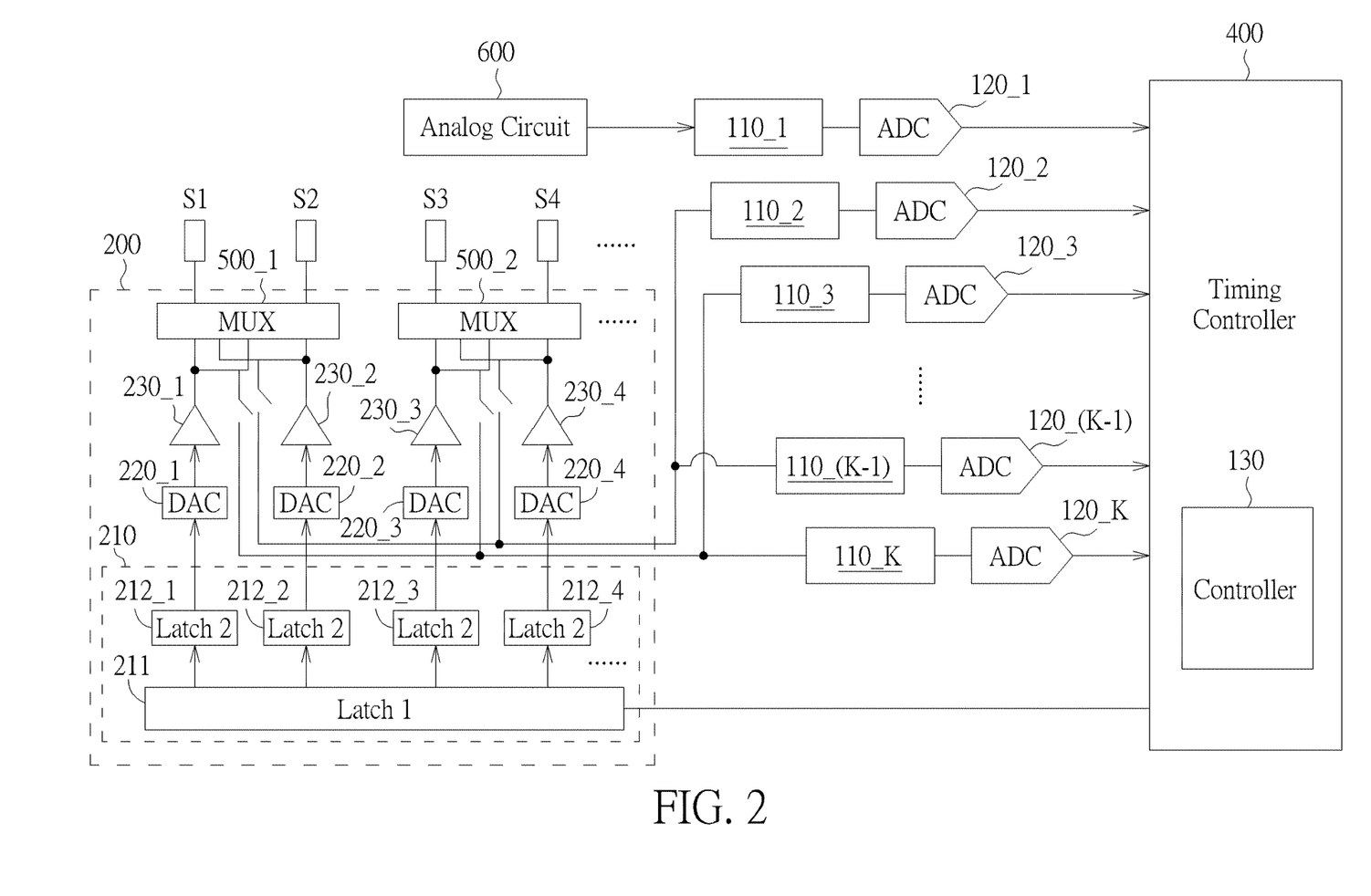
FIG. 2 depicts a detailed schematic diagram of a TDDI IC and a display device according to one embodiment of the present invention.

Please refer to FIG. 2, which depicts a detailed schematic diagram of a TDDI IC and a display device according to one embodiment of the present invention. As shown, the display driving circuit 200 comprises a latching circuit 210, a plurality of digital-to-analog converters 220_1-220_N, a plurality of source drivers 230_1-230_N. The latching circuit 210 comprises a first latch 211 and a plurality of second latches 212_1-212_N. During display driving periods of the TDDI IC 50 and the display device 10, the timing controller 400 is configured to send image data to be displayed to the first latch 211 of the latching circuit 210. Upon complete reception of data for a (horizontal) line of an image by the first latch 211, the data of the line of the image is then relayed to the plurality of second latches 212_1-212_N of the latching circuit 210. Each of the second latches 212_1-212_N receives and outputs a data segment (e.g., data pertaining to RGB sub-pixels of the horizontal line) of the data of the line of the image to one of the digital-to-analog converters 220_1-220_N. Accordingly, each of the digital-to-analog converters 220_1-220_N is configured to convert its received data segment into a converted analog voltage and forward it to a corresponding one of the source drivers 230_1-230_N. In turn, each of the source drivers 230_1-230_N applies its received converted analog voltage to a corresponding one of the source electrodes S0-SP (as a pixel driving voltage), for manipulating respective pixel circuits on the display panel 300, thereby displaying the image line by line.

The touch control circuit 100 comprises a plurality of voltage conversion circuit 110_1-110_K (which can be optional), a plurality of analog-to-digital converters 120_1-120_K and a controller 130. During touch sensing periods of the TDDI IC 50 and the display device 10, the analog-to-digital converters 120_1-120_K is configured to respectively convert analog voltages sensed on the touch sensing electrodes TS0-TST, which are indicative of touch interactions on the display panel 300, to generate digital touch sensed signals (which can be in form of digital codes). The generated touch sensed signals encapsulate the intensity, location, and other relevant touch attributes detected by the touch sensing electrodes TS0-TST. Upon generation, these digital touch sensed signals are then relayed to the controller 130. The controller 130 is configured to interpret these digital touch sensed signals to ascertain the presence, nature, and specifics of one or more touch events on the display panel 300. The controller 130 analyzes the incoming data to distinguish between various touch gestures, thereby enabling accurate and responsive touch interaction with the display device 10.

During safety detection periods of the TDDI IC 50 and the display device 10, outputs of the source drivers 230_1-230_N are coupled to the touch control circuit 100 through multiplexers 500_1-500_J and switches. In one embodiment, outputs voltages of the source drivers 230_1-230_N can be initially directed to the voltage conversion circuits 110_1-110_K, which are capable of adjusting (shifting) the output voltages to transferred voltages whose levels are suitable for an input voltage range of the analog-to-digital converters 120_1-120_K. However, this routing through the voltage conversion circuits 110_1-110_K is not the only possible configuration as per the scope of the present invention. In various embodiments, the output voltages of the source drivers 230_1-230_N can be directly fed into the analog-to-digital converters 120_1-120_K, bypassing any voltage level adjustment. The primary objective of the voltage conversion circuits 110_1-110_K is to modify the output voltages of the source drivers 230_1-230_N such that the output voltages of the source drivers 230_1-230_N can align with the input voltage range of the analog-to-digital converters 120_1-120_K. This input voltage range is defined as a range of voltage levels that the analog-to-digital converters 120_1-120_K can precisely interpret. Typically, the voltage input range of the analog-to-digital converters 120_1-120_K is limited. Input voltages outside of the input voltage range could lead to the generation of inaccurate digital values by the analog-to-digital converters 120_1-120_K, since the analog-to-digital converters 120_1-120_K are specifically designed to convert voltages only within their prescribed range. Thus, the function of the voltage conversion circuits 110_1-110_K is to adjust/shift any input voltage that either exceeds or falls short of the input voltage range of the analog-to-digital converters 120_1-120_K. This adjustment ensures that the voltage falls within the range that the analog-to-digital converters 120_1-120_K can accurately process, thereby guaranteeing reliable and accurate digital conversion of the input signals.

The analog-to-digital converters 120_1-120_K of the touch control circuit 100 are configured to convert either the output voltages of the source drivers 230_1-230_N or the transferred voltages into corresponding measured digital codes. The controller 130 is configured to perform comparative analysis between the measured digital codes and predefined input digital codes. Specifically, the input digital codes are data segments of the line of the image that are respectively and individually fed to the each of the digital-to-analog converters 220_1-220_N. If an input digital code is not consistent with a measured digital code, this indicates a potential malfunction in either a corresponding one of the source drivers 230_1-230_N or a corresponding one of the digital-to-analog converters 220_1-220_N since the input digital code inputted to each of the digital-to-analog converters 220_1-220_N should be consistent with the measured digital code generated by a corresponding one of the analog-to-digital converters 120_1-120_K. Thus, the controller 130 generates a safety detection result indicative of whether each of source drivers 230_1-230_N operates properly without any faults based on the measured digital codes and the input digital codes. In one embodiment, the controller 130 could be integrated as a part of the timing controller 400.

Figure 3:
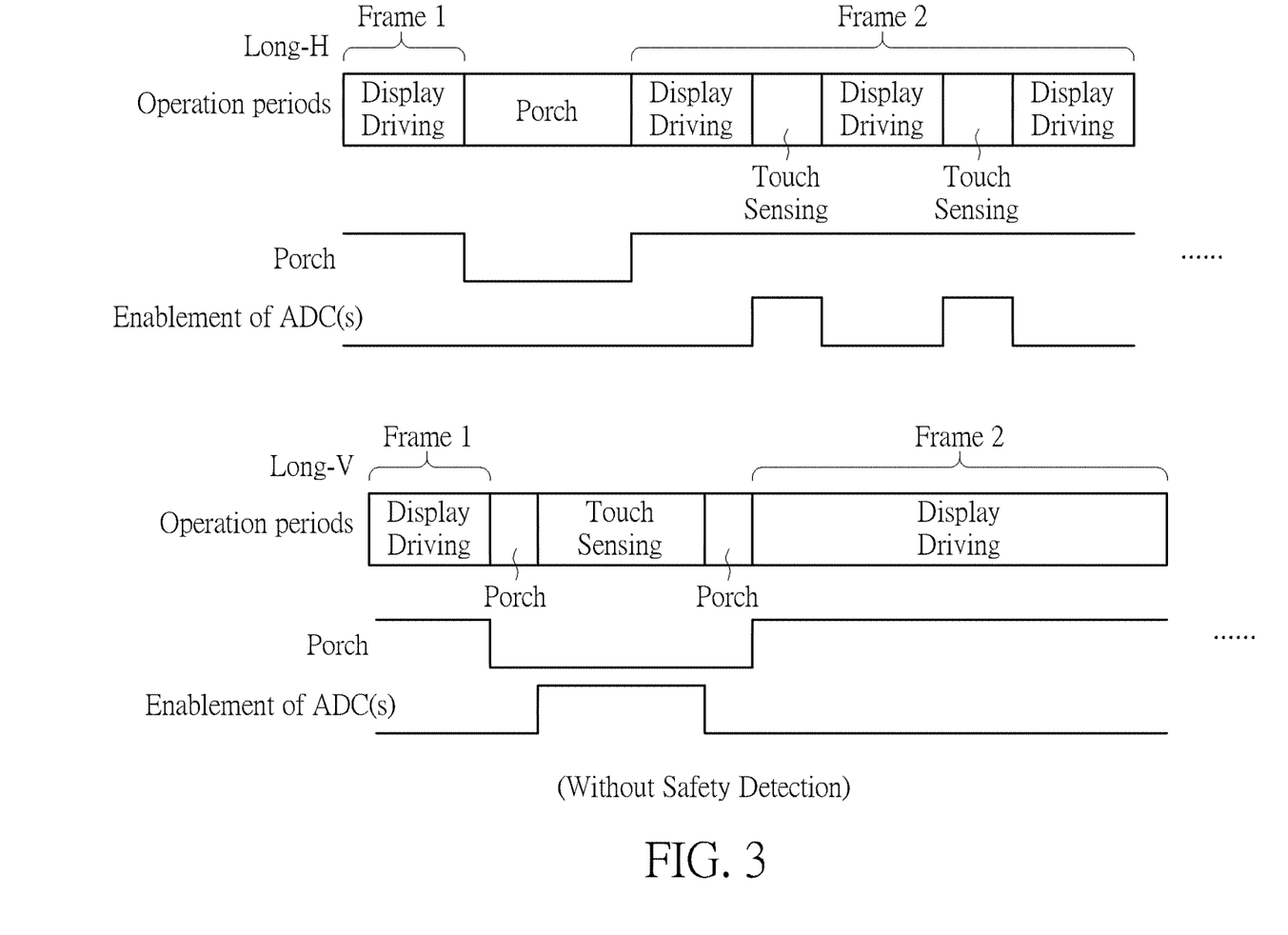
FIG. 3 and FIG. 4 depicts operation periods and enablement of analog-to-digital converters of an TDDI IC and a display device.
Figure 4:
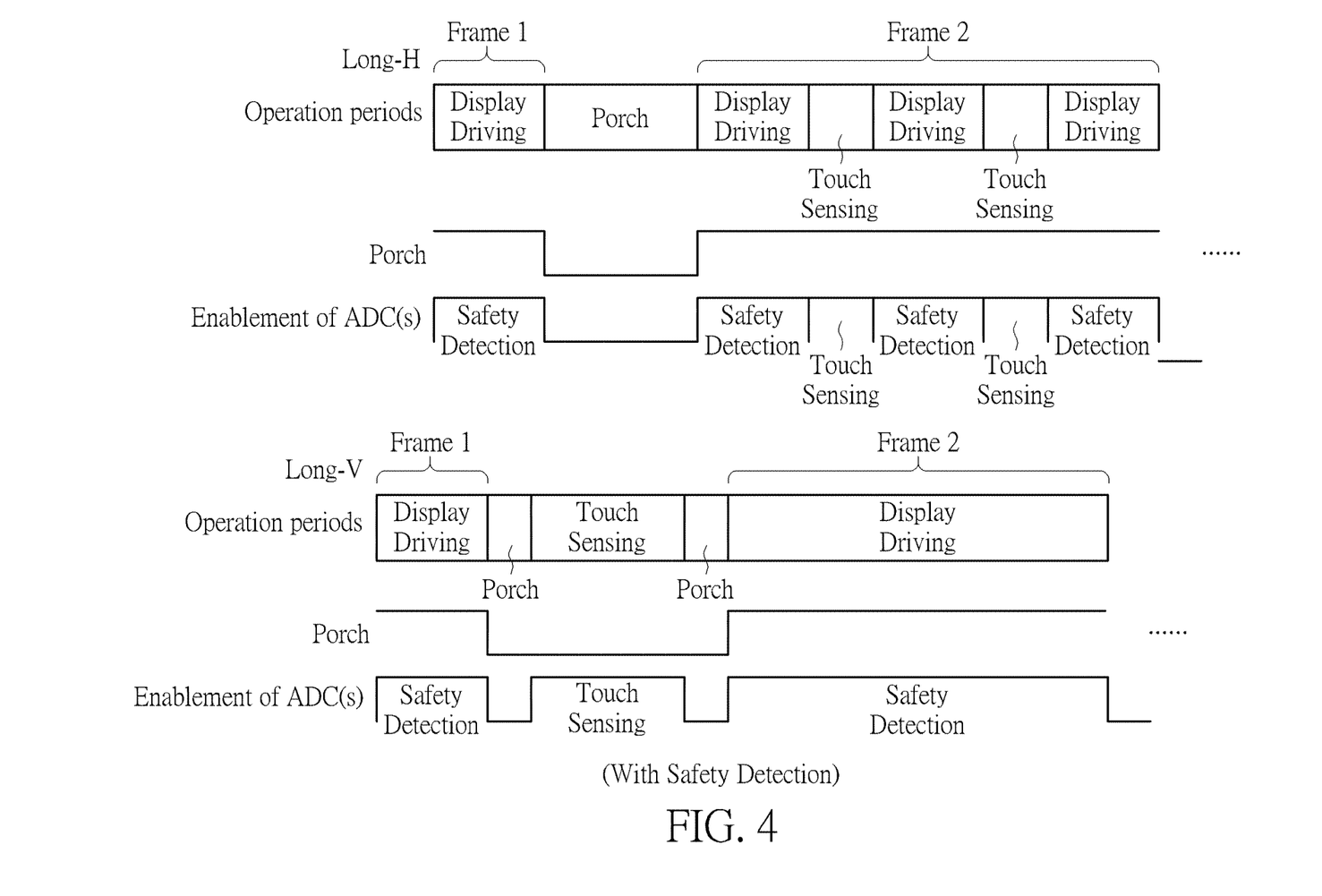

The safety detection provided by the present invention is based on a time-sharing utilization on the analog-to-digital converters 120_1-120_K. Please refer to FIG. 3 and FIG. 4 for further understandings. Typically, the analog-to-digital converters 120_1-120_K is trigger/enabled to convert voltages sensed on the touch sensing electrodes during touch sensing periods in a long-V or a long-H mode, where long-V mode is inter-frame touch driving, which means touch sensing operations are performed between the two display frame periods (i.e., a blanking period) and long-H mode is intra-frame touch driving, which means touch sensing operations are inserted and performed within one display frame period. In the present invention, the analog-to-digital converters 120_1-120_K is utilized to facilitate the safety detection during display driving periods of the TDDI IC 50 and the display device 10 since touch sensing operations only need to be performed during touch sensing periods of the TDDI IC 50 and the display device 10 and therefore the analog-to-digital converters 120_1-120_K is available for other purposes during sensing non-touch periods. Thus, the analog-to-digital converters 120_1-120_K can be enabled/triggered to facilitate the safety detection during non-touch sensing periods (e.g., display driving periods or porch periods) of the TDDI IC 50 and the display device 10.

The number of the source drivers 230_1-230_N may be not identical to the number of the analog-to-digital converters 120_1-120_K of the touch control circuit 100, and it is often the case that there are more source drivers 230_1-230_N than the analog-to-digital converters 120_1-120_K of the touch control circuit 100. Given the limited number of the analog-to-digital converters 120_1-120_K available, it is not feasible to conduct the safety detection on the all source drivers 230_1-230_N simultaneously. Therefore, safety detection may be performed in batches in some embodiments of the present invention. That is, the safety detection is performed on only a portion of the source drivers 230_1-230_N during a single one safety detection period. In some embodiments, the safety detection on a first portion of source drivers 230_1-230_N can be performed during a display driving period of displaying a first frame on the display panel 300, while the safety detection on a second portion of source drivers 230_1-230_N can be performed during a display driving period of displaying a second frame on the display panel 300.

In one embodiment, the safety detection mechanism provided by the present invention can be further applied to one or more analog circuits 600 of the display device 10. According to various embodiments, the one or more analog circuits 600 could comprise at least one of a voltage regulator (e.g., low-dropout regulator (LDO)), a charge pump, a gamma voltage regulator and a gate voltage generator of the display device 10.

Furthermore, since the output voltages of the one or more analog circuits 600 may either exceed or fall below the input voltage range of the analog-to-digital converters 120_1-120_K, these output voltages might require conversion to appropriate levels before being read and converted by the analog-to-digital converters 120_1-120_K. However, not all the output voltages of the one or more analog circuits 600 necessitate such conversion. In certain scenarios, the output voltages of the one or more analog circuits 600 can be directly read and converted by the analog-to-digital converters 120_1-120_K without any prior adjustment to transferred voltages. In addition, the output voltages of the one or more analog circuits 600 or their corresponding transferred voltages are converted into measured digital codes by the analog-to-digital converters 120_1-120_K. The converted measured digital codes would be compared with a target digital code range. The target digital code range indicates a predefine range of the output voltages of the one or more analog circuits 600. If the measured digital codes exceed or fall below the predefine range of the output voltages of the one or more analog circuits 600, this indicates a potential malfunction in the one or more analog circuits 600. Thus, the controller 130 generates a safety detection result indicative of whether each of the one or more analog circuits 600 operates properly without any faults. According to various embodiments, the safety detection on the one or more analog circuits 600 can be performed during any non-touch sensing periods (e.g., display driving periods or porch periods) of the TDDI IC 50 and the display device 10.

Figure 5:
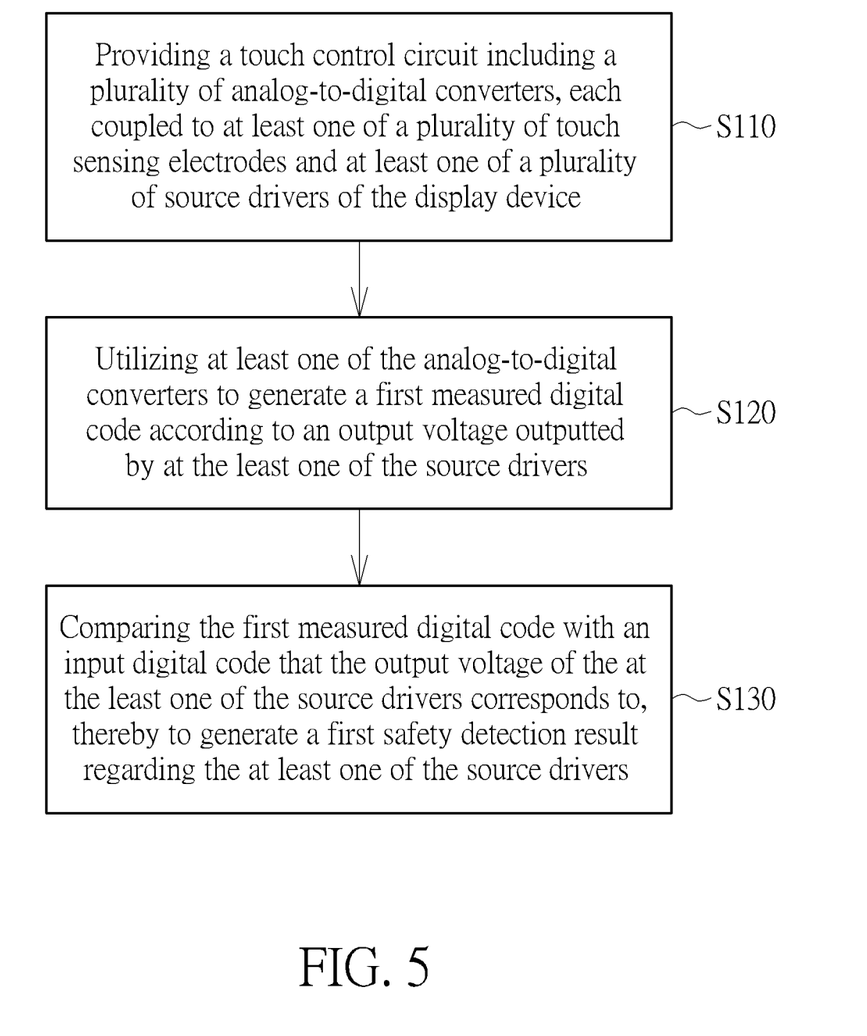
FIG. 5 depicts a safety detection method for use in a display device according to one embodiment of the present invention.

FIG. 5 illustrates a safety detection method for use in a display device according to one embodiment of the present invention. As shown in the figure, the method of the present invention includes the following simplified flow:

Step S110: providing a touch control circuit including a plurality of analog-to-digital converters, each coupled to at least one of a plurality of touch sensing electrodes and at least one of a plurality of source drivers of the display device;

Step S120: utilizing at least one of the analog-to-digital converters to generate a first measured digital code according to an output voltage outputted by at the least one of the source drivers; and Step S130: comparing the first measured digital code with an input digital code that the output voltage of the at the least one of the source drivers corresponds to, thereby to generate a first safety detection result regarding the at least one of the source drivers.

Since principles and specific details of the foregoing steps have been explained in detail through the above embodiments, further descriptions will not be repeated here. It should be noted that the above flow may be possible, by adding other extra steps or making appropriate modifications and adjustments, to better improve flexibility and further improve performance and efficiency of the TDDI IC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch control circuit for use in a display device, comprising:
    a plurality of analog-to-digital converters, each coupled to at least one of a plurality of touch sensing electrodes and at least one of a plurality of source drivers of the display device, at least one of the analog-to-digital converters is configured to generate a first measured digital code according to an output voltage outputted by at the least one of the source drivers; and
    a controller, coupled to the analog-to-digital converters, configured to compare the first measured digital code with an input digital code that the output voltage of the at the least one of the source drivers corresponds to, thereby to generate a first safety detection result regarding the at least one of the source drivers.

2. The touch control circuit of claim 1, wherein the source drivers are included in a display driving circuit of the display device, the display driving circuit is configured to apply voltages to a plurality of source electrodes of the display device, and the display driving comprises circuit a plurality of digital-to-analog converters, each of the digital-to-analog converters is configured to generate a converted voltage according to one input digital code, and each of the source drivers is configured to generate one output voltage to at least one of the source electrodes according to the converted voltage.

3. The touch control circuit of claim 1, wherein the touch control circuit further comprises:
    at least one voltage conversion circuit, coupled to the at least one of the analog-to-digital converters, configured to generate a transferred voltage according to the output voltage outputted by the at least one of the source drivers, and the at least one of the analog-to-digital converters is configured to convert the transferred voltage into the first measured digital code.

4. The touch control circuit of claim 1, wherein the at least one of the analog-to-digital converters is coupled to an analog circuit of the display device and configured to generate a second measured digital code according to an output voltage of the analog circuit, and the controller is configured to compare the second measured digital code with a reference digital code range that the output voltage of the analog circuit corresponds to, thereby to generate a second safety detection result regarding the analog circuit.

5. The touch control circuit of claim 4, wherein the analog circuit comprises at least one of a voltage regulator, a charge pump, a gamma voltage generator and a gate voltage generator.

6. The touch control circuit of claim 4, the touch control circuit further comprises:
    at least one voltage conversion circuit, coupled to the at least one of the analog-to-digital converters, configured to generate a transferred voltage according to the output voltage of the analog circuit, and the at least one of the analog-to-digital converters is configured to convert the transferred voltage into the second measured digital code.

7. The touch control circuit of claim 1, wherein the at least one of the analog-to-digital converters is configured to generate the first measured digital code according to the output voltage outputted by the at the least one of the source drivers during a display period of the display device, and configured to generate a touch sensed digital code according to a voltage sensed on at least one of the touch sensing electrodes during a touch sensing period of the display device.

8. The touch control circuit of claim 1, wherein the at least one of the analog-to-digital converters is configured to generate a third measured digital code according to an output voltage outputted by a first source driver of the source drivers during a first display period of displaying a first frame on the display device, and configured to generate a fourth measured digital code according to an output voltage outputted by a second source driver of the source drivers during a second display period of displaying the first frame on the display device; the first display period and the second display period is separated by a touch sensing period of the display device.

9. The touch control circuit of claim 1, wherein the controller is including in a timing controller of the display device.

10. A touch and display driver integration (TDDI) comprises the touch control circuit of claim 1.

11. A safety detection method for use in a display device, comprising:
    providing a touch control circuit including a plurality of analog-to-digital converters, each coupled to at least one of a plurality of touch sensing electrodes and at least one of a plurality of source drivers of the display device;
    utilizing at least one of the analog-to-digital converters to generate a first measured digital code according to an output voltage outputted by at the least one of the source drivers; and
    comparing the first measured digital code with an input digital code that the output voltage of the at the least one of the source drivers corresponds to, thereby to generate a first safety detection result regarding the at least one of the source drivers.

12. The safety detection method of claim 11, wherein the source drivers are included in a display driving circuit of the display device, the display driving circuit is configured to apply voltages to a plurality of source electrodes of the display device, and the display driving circuit comprises a plurality of digital-to-analog converters, each of the digital-to-analog converters is configured to generate a converted voltage according to one input digital code, and each of the source drivers is configured to generate one output voltage to at least one of the source electrodes according to the converted voltage.

13. The safety detection method of claim 11, further comprising:
    providing at least one voltage conversion circuit coupled to the at least one of the analog-to-digital converters;

utilizing the at least one voltage conversion circuit to generate a transferred voltage according to the output voltage outputted by the at least one of the source drivers; and utilizing the at least one of the analog-to-digital converters is configured to convert the transferred voltage into the first measured digital code.

14. The safety detection method of claim 11, further comprising:

utilizing the at least one of the analog-to-digital converters to generate a second measured digital code according to an output voltage of an analog circuit of the display device; and comparing the second measured digital code with a reference digital code range that the output voltage of the analog circuit corresponds to, thereby to generate a second safety detection result regarding the analog circuit.

15. The safety detection method of claim 14, wherein the analog circuit comprises at least one of a voltage regulator, a charge pump, a gamma voltage generator and a gate voltage generator.

16. The safety detection method of claim 14, further comprising:

providing at least one voltage conversion circuit coupled to the at least one of the analog-to-digital converters;

utilizing the at least one voltage conversion circuit to generate a transferred voltage according to the output voltage of the analog circuit; and utilizing the at least one of the analog-to-digital converters is configured to convert the transferred voltage into the second measured digital code.

17. The safety detection method of claim 11, further comprising:

utilizing the at least one of the analog-to-digital converters to generate the first measured digital code according to the output voltage outputted by the at the least one of the source drivers during a display period of the display device; and utilizing the at least one of the analog-to-digital converters generate a touch sensed digital code according to a voltage on at least one of the touch sensing electrodes during a touch sensing period of the display device.

18. The safety detection method of claim 11, further comprising:

utilizing the at least one of the analog-to-digital converters to generate a third measured digital code according to an output voltage outputted by a first source driver of the source drivers during a first display period of displaying a first frame on the display device; and utilizing the at least one of the analog-to-digital converters to generate a fourth measured digital code according to an output voltage outputted by a second source driver of the source drivers during a second display period of displaying the first frame on the display device;

wherein the first display period and the second display period is separated by a touch sensing period of the display device.

* * * * *